(12) United States Patent
Lavan et al.

(10) Patent No.: US 8,339,865 B2
(45) Date of Patent: Dec. 25, 2012

(54) NON BINARY FLASH ARRAY ARCHITECTURE AND METHOD OF OPERATION

(75) Inventors: Avi Lavan, Yokneam-Elit (IL); Ran Sahar, Netanya (IL)

(73) Assignee: Spansion Israel Ltd, Netanya (IL)

( * ) Notice: Subject to any disclaimer, the term of this patent is extended or adjusted under 35 U.S.C. 154(b) by 1008 days.

(21) Appl. No.: 12/289,724

(22) Filed: Nov. 3, 2008

(65) Prior Publication Data

US 2009/0204747 A1 Aug. 13, 2009

Related U.S. Application Data

(60) Provisional application No. 60/984,402, filed on Nov. 1, 2007.

(51) Int. Cl.
*G11C 16/04* (2006.01)

(52) U.S. Cl. .......... 365/185.29; 365/185.11; 365/185.12

(58) Field of Classification Search ............. 365/185.29, 365/185.11, 185.12
See application file for complete search history.

(56) References Cited

U.S. PATENT DOCUMENTS

| | | | |
|---|---|---|---|
| 5,315,558 A | 5/1994 | Hag | |
| 5,768,192 A | 6/1998 | Eitan | |
| 5,854,763 A | 12/1998 | Gillingham | |
| 5,963,465 A | 10/1999 | Eitan | |
| 5,966,603 A | 10/1999 | Eitan | |
| 6,011,725 A | 1/2000 | Eitan | |
| 6,030,871 A | 2/2000 | Eitan | |
| 6,069,827 A * | 5/2000 | Sinclair | 365/185.29 |
| 6,133,095 A | 10/2000 | Eitan | |
| 6,215,148 B1 | 4/2001 | Eitan | |
| 6,233,180 B1 | 5/2001 | Eitan | |
| 6,285,574 B1 | 9/2001 | Eitan | |
| 6,292,394 B1 | 9/2001 | Cohen | |
| 6,448,750 B1 | 9/2002 | Shor | |
| 6,477,084 B1 | 11/2002 | Eitan | |
| 6,552,387 B1 | 4/2003 | Eitan | |
| 6,583,007 B1 | 6/2003 | Eitan | |
| 6,633,496 B2 | 10/2003 | Maayan | |
| 6,649,972 B2 | 11/2003 | Eitan | |
| 6,954,393 B2 | 10/2005 | Lusky | |
| 6,967,896 B2 | 11/2005 | Eisen | |

OTHER PUBLICATIONS

"Design Considerations in Scaled SONOS Nonvolatile Memory Devices" found at: http://klabs.org/richcontent/MemoryContent/nvmt_symp/nvmts_2000/presentations/bu_white_sonos_lehigh_univ.pdf.

"SONOS Nonvolatile Semiconductor Memories for Space and Military Applications" found at: http://klabs.org/richcontent/MemoryContent/nvmt_symp/nvmts_2000/papers/adams_dpdf.

(Continued)

*Primary Examiner* — Huan Hoang
(74) *Attorney, Agent, or Firm* — Eitan Mehulal & Sadot (57) ABSTRACT

A Flash memory array comprises a plurality of Erase Sectors (Esecs) arranged in a plurality of Erase Sector Groups (ESGs), Physical Pages (slices), and Physical Sectors (PSecs), and there is a non-binary number of at least one of the Erase Sector Groups (ESGs), Physical Pages (slices), and Physical Sectors (PSecs). A user address is translated into a physical address using modular arithmetic to determine pointers (ysel, esg, psec) for specifying a given Erase Sector (ESec) within a given Erase Sector Group (ESG); a given Erase Sector Group (ESG) within a given Physical Sector (Psec); and a given Physical Sector (PSec) within the array.

19 Claims, 4 Drawing Sheets

OTHER PUBLICATIONS

"Philips Research—Technologies—Embedded Nonvolatile Memories" found at: http://www.research.philips.com/technologies/ics/nvmemories/index.html.

"Semiconductor Memory: Non-Volatile Memory (NVM)" found at: http://www.ece.nus.edu.sg/stfpage/elezhucx/myweb/NVM.pdf.

* cited by examiner

8 Physical Pages

FIG. 4B

9 Physical Pages

NON BINARY FLASH ARRAY ARCHITECTURE AND METHOD OF OPERATION

CROSS-REFERENCE(S) TO RELATED APPLICATION(S)

This application claims priority from U.S. Provisional Patent Application No. 60/984,402 filed Nov. 1, 2007 which is hereby incorporated by reference in its entirety.

TECHNICAL FIELD

The disclosure relates to semiconductor devices and, more particularly, to techniques for implementing and operating non-volatile memory (NVM), such as floating gate (FG) devices or charge-trapping devices such as nitride read only memory (NROM) devices, or other microelectronic cells or structures.

BACKGROUND

Memory arrays are well known, and comprise a plurality (many, including many millions) of memory cells organized (including physically arranged) in rows (usually represented in drawings as going across the page, horizontally, from left-to-right) and columns (usually represented in drawings as going up and down the page, from top-to-bottom).

Figure 1:
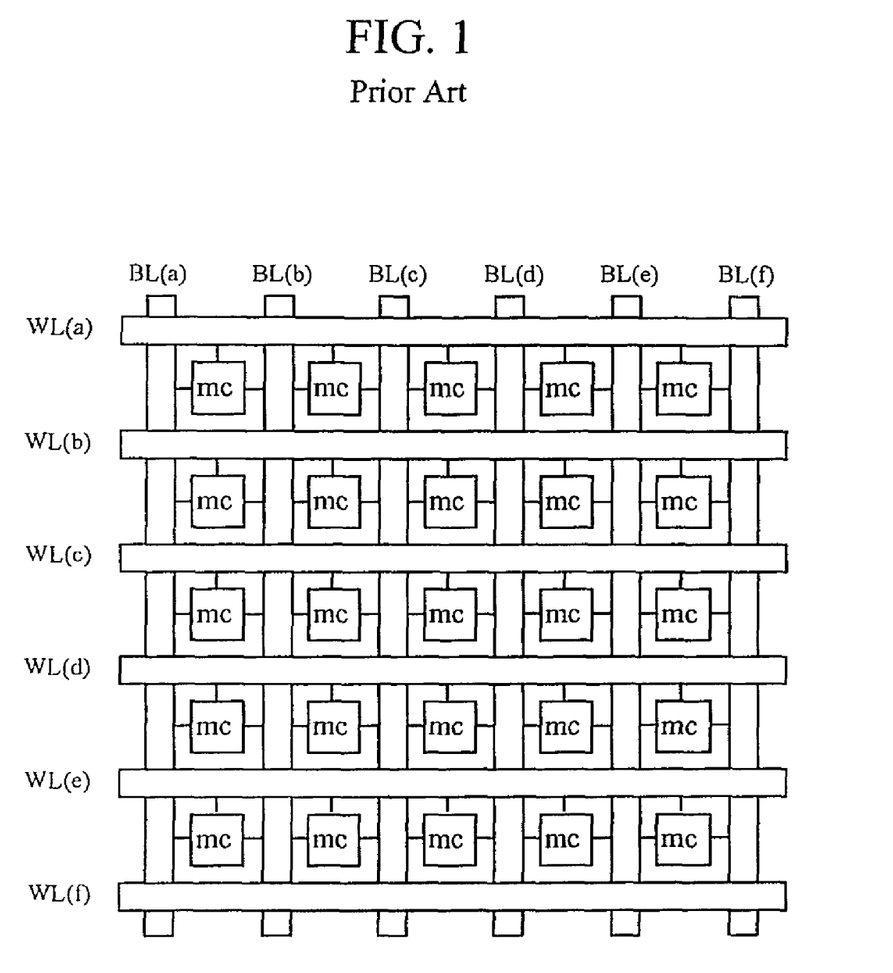
FIG. 1 is a diagram of a "generic" memory array, according to the prior art.

FIG. 1 illustrates an exemplary, generic memory array. A plurality of bitlines, labeled BL(a) through BL(f), may extend in parallel with one another, vertically through the array (or a portion thereof). A plurality of wordlines, labeled WL(a) through WL(f), may extend in parallel with one another, horizontally through the array (or a portion thereof). The wordlines may be at a higher level than (deposited above) the bitlines.

A plurality of memory cells, each labeled "mc", are disposed in the array, and may be connected to selected ones of the wordlines and bitlines passing thereby. The memory cells illustrated in FIG. 1 are representative of many millions of memory cells that may be resident on a single chip. The memory cells may, generally, be any type of memory cell such as floating gate (FG) devices or charge-trapping devices such as nitride read only memory (NROM) devices, or other microelectronic cells or structures. The gates of field-effect transistor (FET) based memory cells, such as FG or NROM, may be connected to the wordlines, and source/drain diffusions of the FET-based memory cells may be connected between adjacent bitlines, as shown.

Flash Memory

Flash memory is a form of non-volatile memory (NVM) that can be electrically erased and reprogrammed. Flash memory architecture usually allows multiple memory locations to be erased or written in one programming operation. However, an erase operation is not mandatory for a Flash memory. A Flash memory can be designed to support only Program and Read operations. This kind of product is called OTP—"One Time Program".

Generally, a Flash memory array may comprise a plurality (such as thousands) of Erase Sectors (ESecs, or ESs). The ESecs may be arranged in a plurality of Erase Sector Groups (ESGs), Physical Pages, and Physical Sectors (PSecs, or PSs).

Figure 4A:
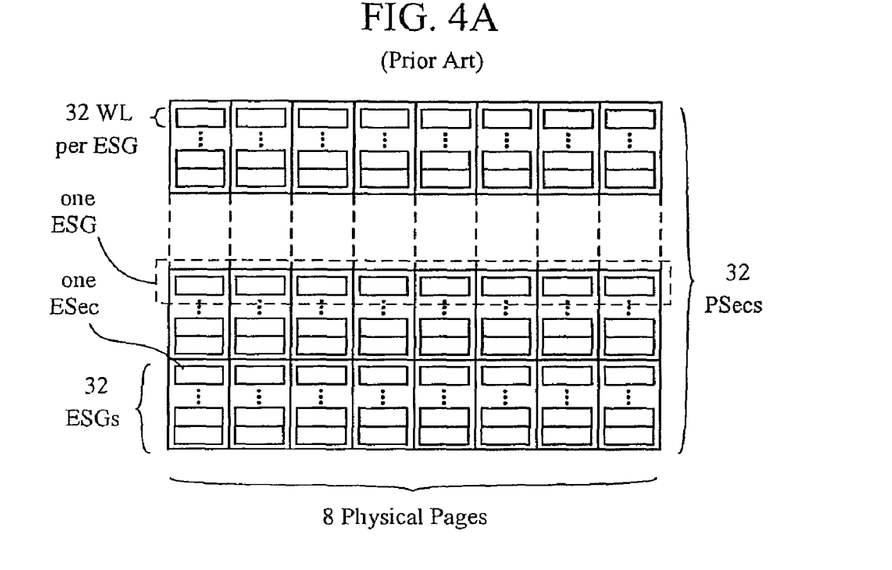
FIG. 4A is a diagram of a memory array having binary dimensions, according to the prior art.

Refer, for example, to FIG. 4A, which illustrates an exemplary binary memory array having a plurality of Erase Sectors (ESecs), a plurality of Erase Sector Groups (ESGs), a plurality of Physical Pages, and a plurality of Physical Sectors (PSecs).

Generally, all of the Erase Sectors (ESecs) in a Flash memory array are the same as one another, and there are usually a binary number of ESecs in each Erase Sector Group (ESG), a binary number of Erase Sector Groups (ESGs) in a Physical Page, and a binary number of ESGs in a Physical Sector (PSec).

In Flash memory, when an erase command is applied, all of the pages in an ESec will be erased. The ESec is sometimes referred to as a "block". In FIG. 4A, each of the little rectangular blocks represents an Erase Sector (ESec) and, as mentioned above, typically there are thousands (or more) of ESecs in a Flash memory array.

An Erase Sector Group (ESG) may comprise a number (such as 32) of wordlines, generally extending horizontally across the memory array. Or, another way of looking at it, an Erase Sector Group (ESG) may comprise a number of Erase Sectors (ESec) extending horizontally, next to one another, and sharing the same wordlines, across the memory array. See the dashed line box (and legend "one ESG") in FIG. 4A.

Within a given Erase Sector (ESec), each wordline may be divided into a number (such as 4) of segments, which may be referred to as "pages". A single wordline (WL) of a single given ESec may thus comprise several pages. Or, sometimes the term "page" may be used to refer to the aggregate of comparable (such as the first, second, third, eighth . . . ) segments from a few different wordlines in the ESec, rather than a segment of only one wordline in the ESec.

A number (such as tens of, such as 32) of Erase Sector Groups (ESGs) may be disposed one atop the other (sharing vertical bitlines), and may constitute a single Physical Sector (PSec). There may be a number (such as tens of, such as 32) of Physical Sectors (PSecs) disposed one atop the other. The total number of Erase Sector Groups (ESGs) would thus be the number of ESGs per PSec (such as 32) times the number of PSecs (such as 32). In this example, there would be 1024 ESGs.

As discussed in greater detail hereinbelow, the physical address of a given Erase Sector (ESec) may comprise three "pointers", one pointer (ysel) specifying which of the Erase Sectors (ESecs) within a given Erase Sector Group (ESG)

another pointer (esg) specifying which of the Erase Sector Groups (ESGs) within a given Physical Sector (PSec); and another pointer (psec) specifying which of the Physical Sectors (PSecs) within the array.

And, the physical address of a given memory location within the given Erase Sector (ESec) may comprise two pointers, one pointer specifying the wordline within the given Erase Sector (ESec); and another pointer specifying which page (portion of the wordline(s)) in the given Erase Sector (ESec).

A Physical Sector (PSec) may comprise many more wordlines than an Erase Sector Group (ESG), since there are many ESGs in the PSec. A group of wordlines of a given PSec may be separated from another group of wordlines for another PSec by a select area comprising logic circuitry. When an address is asserted, only one given PSec may be active, and all others may be inactive.

Generally, the number of wordlines (WLs) in each of the Physical Sectors (PSecs) may be made to be the same as one another, to maintain the memory cells in the same physical "environment". The number of wordlines (WLs) is typically a binary number, such as 1024 or 2048. This differs, for example, from technologies which may have different numbers of wordlines in different physical sectors of a given memory array. And, since the Physical Sectors (PSecs) are disposed one atop the other, they share the same bitlines (or sets of bitlines).

A Physical Page, also referred to as a "slice", is generally a binary number (such as 32) of bitlines, and comprises vertically aligned segments of the Physical Sectors (PSecs), as well as corresponding vertically-aligned segments of the Erase Sector Groups (ESGs). Stated another way, a Physical Page (slice) comprises a column of many Erase Sectors (ESecs) which are disposed one above the other.

In a "binary array", there are a binary number (such as 32) of PSecs, a binary number (such as 8) of Physical Pages (slices), and a binary number (such as 32) of ESecs. Usually, there are also a binary number (such as 32) of wordlines (WLs) in an ESec, and all of the ESecs in a Flash memory array are identical to one another.

Another grouping of Erase Sectors (ESecs), for example a number (typically binary, such as 32) of Erase Sectors (ESecs) disposed one above the other within a given Physical Sector (PSec) is not given a distinct name.

Memory Blocks and Non-Binary Array Architecture

A memory array may be arranged in blocks of memory, such as Erase Sectors (ESecs), erase sector groups (ESGs), physical pages (or slices) and Physical Sectors (PSecs). In a binary array, there are a number of each of these memory blocks, and the number for each memory block is a power of two (such as 8, 16 or 32). For example, a memory array may have 32 Erase Sectors (ESecs), 8 physical pages (slices) and 32 Physical Sectors (PSecs). Additionally, each Erase Sector (ESec) may comprise a number of wordlines which is also binary, such as 32.

Binary addressing schemes favor memories in which the number of addressable cells is a power of two. For a rectangular array of cells, this generally requires that the number of cell rows is a power of two, and that the number of cell columns is a power of two.

As applied to an array, "non-binary" refers to a rectangular array in which neither the number of columns nor the number of rows is a power of two. For example, 3×3 is a "non-binary" array, while 2×2 is a binary array In a block architecture, such as a divided word architecture, the foregoing constraints can be applied to the arrangement of blocks.

Given a packaging standard, a non-binary array may provide a memory of greater capacity that is available using the nearest binary or semi-binary array.

Commonly-owned patents disclose structure and operation of NROM and related ONO memory cells. Some examples may be found in commonly-owned U.S. Pat. Nos. 5,768,192, 6,011,725, 6,649,972 and 6,552,387.

Commonly-owned patents disclose architectural aspects of an NROM and related ONO array (some of which have application to other types of NVM array), such as segmentation of the array to handle disruption in its operation, and symmetric architecture and non-symmetric architecture for specific products, as well as the use of NROM and other NVM array (s) related to a virtual ground array. Some examples may be found in commonly-owned U.S. Pat. Nos. 5,963,465, 6,285,574 and 6,633,496.

Commonly-owned patents also disclose additional aspects at the architecture level, including peripheral circuits that may be used to control an NROM array or the like. Some examples may be found in commonly-owned U.S. Pat. Nos. 6,233,180, and 6,448,750.

Commonly-owned patents also disclose several methods of operation of NROM and similar arrays, such as algorithms related to programming, erasing, and/or reading such arrays. Some examples may be found in commonly-owned U.S. Pat. Nos. 6,215,148, 6,292,394 and 6,477,084.

Commonly-owned patents also disclose manufacturing processes, such as the process of forming a thin nitride layer that traps hot electrons as they are injected into the nitride layer. Some examples may be found in commonly-owned U.S. Pat. Nos. 5,966,603, 6,030,871, 6,133,095 and 6,583,007.

Commonly-owned patents also disclose algorithms and methods of operation for each segment or technological application, such as: fast programming methodologies in all flash memory segments, with particular focus on the data flash segment, smart programming algorithms in the code flash and EEPROM segments, and a single device containing a combination of data flash, code flash and/or EEPROM. Some examples may be found in commonly-owned U.S. Pat. Nos. 6,954,393 and 6,967,896.

Where applicable, descriptions involving NROM are intended specifically to include related oxide-nitride technologies, including SONOS (Silicon-Oxide-Nitride-Oxide-Silicon), MNOS (Metal-Nitride-Oxide-Silicon), MONOS (Metal-Oxide-Nitride-Oxide-Silicon) and the like used for NVM devices. Further description of NVM and related technologies may be found at "Non Volatile Memory Technology", Vol. 1 & 2 (2005), Vol. 3 (2006) and Vol. 4 (2007), published by Saifun Semiconductor; "Microchip Fabrication", by Peter Van Zant, $5^{th}$ Edition 2004; "Application-Specific Integrated Circuits" by Michael John Sebastian Smith, 1997; "Semiconductor and Electronic Devices", by Adir Bar-Lev, $2^{nd}$ Edition, 1999; "Digital Integrated Circuits" by Jan. M. Rabaey, Anantha Chandrakasan and Borivoje Nikolic, $2^{nd}$ Edition, 2002 and materials presented at and through http://siliconnexus.com, "Design Considerations in Scaled SONOS Nonvolatile Memory Devices" found at: http://klabs.org/richcontent/MemoryContent/nvmt_symp/nvmts_2000/presentations/bu_white_sonos_lehigh_univ.pdf, "SONOS Nonvolatile Semiconductor Memories for Space and Military Applications" found at: http://klabs.org/richcontent/MemoryContent/nvmt_symp/nvmts_2000/papers/adams_d.pdf, "Philips Research—Technologies—Embedded Nonvolatile Memories" found at: http://www.research.philips.com/technologies/ics/nvmemories/index.html, and "Semiconductor Memory: Non-Volatile Memory (NVM)" found at: http://www.ece.nus.edu.sg/stfpage/elezhucx/myweb/NVM.pdf, all of which are incorporated by reference herein in their entirety.

Glossary

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning, unless contradicted or elaborated upon by other descriptions set forth herein. Some of the terms set forth below may be registered trademarks (®).

When glossary terms (such as abbreviations) are used in the description, no distinction should be made between the use of capital (uppercase) and lowercase letters. For example "ABC", "abc" and "Abc", or any other combination of upper and lower case letters with these 3 letters in the same order, should be considered to have the same meaning as one another, unless indicated or explicitly stated to be otherwise. The same commonality generally applies to glossary terms (such as abbreviations) which include subscripts, which may appear with or without subscripts, such as "$X_{yz}$" and "Xyz".

Additionally, plurals of glossary terms may or may not include an apostrophe before the final "s"—for example, ABCs or ABC's.

array memory cells may optionally be organized in an array of rows and columns, and may be connected to selected bit lines and word lines in the array. The array may be organized into various logical sections containing pluralities of memory cells, such as blocks, pages and physical sectors. Some of these sections may be physically isolated and operated independently from one another.

binary system The binary numeral system, or base-2 number system, is a numeral system that represents numeric values using only two symbols, usually "0" and "1". Owing to its straightforward implementation in electronic circuitry, the binary system is used internally by virtually all modern computers. Many 1s and 0s can be strung together to represent larger numbers. Starting at the right is the "place" for "ones", and there can be either 0 or 1 one's. The next "place" to the left is for "twos", and there can be either 0 or 1 two's. The next "place" to the left is for "fours", and there can be either 0 or 1 fours. The next "place" to the left is for "eights", and there can be either 0 or 1 eights. This continues for as many places as desired, typically 4, 8, 16, 32 or 64 places.

bit The word "bit" is a shortening of the words "binary digit." A bit refers to a digit in the binary numeral system (base 2). A given bit is either a binary "1" or "0". For example, the number 1001011 is 7 bits long. The unit is sometimes abbreviated to "b". Terms for large quantities of bits can be formed using the standard range of prefixes, such as kilobit (Kbit), megabit (Mbit) and gigabit (Gbit). A typical unit of 8 bits is called a Byte, and the basic unit for 128 Bytes to 16K Bytes is treated as a "page". That is the "mathematical" definition of "bit". In some cases, the actual (physical) left and right charge storage areas of an NROM cell are conveniently referred to as the left "bit" and the right "bit", even though they may store more than one binary bit (with MLC, each storage area can store at least two binary bits). The intended meaning of "bit" (mathematical or physical) should be apparent from the context in which it is used.

BL short for bit line. The bit line is a conductor connected to the drain (or source) of a memory cell transistor.

ECC short for error correcting code. An error-correcting code (ECC) is a code in which each data signal conforms to specific rules of construction so that departures from this construction in the received signal can generally be automatically detected and corrected.

Flash memory Flash memory is a form of non-volatile memory (NVM) that can be electrically erased and reprogrammed. Flash memory architecture allows multiple memory locations to be erased or written in one programming operation. Two common types of flash memory are NOR and NAND flash. NOR and NAND flash get their names from the structure of the interconnections between memory cells. In NOR flash, cells are connected in parallel to the bit lines, allowing cells to be read and programmed individually. The parallel connection of cells resembles the parallel connection of transistors in a CMOS NOR gate. In NAND flash, cells are connected in series, resembling a NAND gate, and preventing cells from being read and programmed individually: the cells connected in series must be read in series.

Some systems will use a combination of NOR and NAND memories, where a smaller NOR memory is used as software ROM and a larger NAND memory is partitioned with a file system for use as a random access storage area. NAND is best suited to flash devices requiring high capacity data storage. This type of flash architecture combines higher storage space with faster erase, write, and read capabilities over the execute in place advantage of the NOR architecture. See NAND, NOR.

mod short for modulo. In computing, the modulo operation finds the remainder of division of one number by another. You can think of doing modular arithmetic similar to the way you would, for example, figure time on a (12 hour) clock. In "modulo 12", 10+3=1 because 10+3=13, of course, but 13 mod 12=1 because 13 divided by 12 leaves a remainder of 1.

NAND NAND flash architecture memories are accessed much like block devices such as hard disks or memory cards. The pages are typically 512 or 2,048 or 4,096 bytes in size. Associated with each page are usually a few bytes (typically 12-16 bytes) that are used for storage of an error detection (ED) and correction checksum. The pages are typically arranged in blocks, such as 32 pages of 512 bytes, 64 pages of 2,048 bytes, or 64 pages of 4,096 bytes. With NAND architecture, programming may be performed on a page basis, but erasure can only be performed on a block basis.

Most NAND devices are shipped from the factory with some bad blocks which are typically identified and marked according to a specified bad block marking strategy. The first physical block (block 0) is always guaranteed to be readable and free from errors. Hence, all vital pointers for partitioning and bad block management for the device are located inside this block (typically a pointer to the bad block tables). If the device is used for booting a system, this block may contain the master boot record.

NOR Reading from NOR flash is similar to reading from random-access memory, provided the address and data bus are mapped correctly. Because of this, most microprocessors can use NOR flash memory as execute in place (XIP) memory, meaning that programs stored in NOR flash can be executed directly without the need to copy them into RAM. NOR flash chips lack intrinsic bad block management, so when a flash block is worn out, the software or device driver controlling the device must handle this, or the device will cease to work reliably.

NROM short for nitride(d) read only memory. Generally, a FET-type device having a charge trapping medium such as a nitride layer for storing charges (electrons and holes) in two discrete areas, near the source and drain diffusions, respectively.

NVM short for non-volatile memory. NVM is computer memory that can retain the stored information even when not powered. Examples of non-volatile memory include read-only memory, flash memory, most types of magnetic computer storage devices (for example hard disks, floppy disk drives, and magnetic tape), optical disc drives, and early computer storage methods such as paper tape and punch cards. Non-volatile memory is typically used for the task of secondary storage, or long-term persistent storage. The most widely used form of primary storage today is a volatile form of random access memory (RAM), meaning that when the computer is shut down, anything contained in RAM is lost. Unfortunately most forms of non-volatile memory have limitations which make it unsuitable for use as primary storage. Typically non-volatile memory either costs more or performs worse than volatile random access memory. (By analogy, the simplest form of an NVM memory cell is a simple light switch. Indeed, such a switch can be set to one of two (binary) positions, and "memorize"

that position.) NVM includes floating gate (FG) devices and NROM devices, as well a devices using optical, magnetic and phase change properties of materials.

page Generally, a grouping of memory cells can be termed a word, a grouping of words can be termed a page, and a grouping of pages can be termed a sector. Data may be accessed for reading and programming (or writing) by word or by page, while an entire sector is commonly accessed for erasing. Other definitions of "page" may be used throughout the industry and in this patent application.

RAM short for random access memory. RAM refers to data storage formats and equipment that allow the stored data to be accessed in any order—that is, at random, not just in sequence. In contrast, other types of memory devices (such as magnetic tapes, disks, and drums) can access data on the storage medium only in a predetermined order due to constraints in their mechanical design.

sector a part of the array, usually larger than a page, which usually contains a few pages. A minimum erase might include a sector. For example:
  Erase Sector (ES, or ESec): Group of cells that are erased by single erase command
  Physical Sector (PS, or PSec): Group of ES connected by single grid of Word Lines (WL) and Bit Lines (BL), sharing same set of drivers.

slice a portion of a memory array, such as a group of bitlines, that are connected to one sense amplifier (sense amp, "SA")

virtual ground array a topological architecture of memory cells where there is an electrical connection between neighboring cells.

word line or wordline, (WL). A conductor normally connected to the gate of a memory cell transistor. The wordline may serve as the gate electrode of several of the memory cells.

BRIEF DESCRIPTION(SUMMARY)

According to the disclosure, generally, a non volatile memory (NVM) array, such as a Flash memory array may be implemented with a non-binary number of Physical Sectors (PSecs), Physical Pages (slices) and/or Erase Sector Groups (ESGs). This may improve layout efficiency. (There may also be a non-binary number of wordlines per Erase Sector Group.) Techniques for converting (typically) binary user addresses to the non-binary physical addresses are disclosed.

According to an embodiment of the disclosure, a Flash memory array comprises a plurality of Erase Sectors (ESecs) arranged in a plurality of Erase Sector Groups (ESGs), Physical Pages (slices) and Physical Sectors (PSecs), characterized in that: there is a non-binary number of at least one of the Erase Sector Groups (ESGs), Physical Pages (slices), and Physical Sectors (PSecs). There may be a non-binary number of all of the Erase Sector Groups (ESGs), Physical Pages (slices), and Physical Sectors (PSecs). And, there may be a non-binary number of wordlines per Erase Sector Group (ESG). There may be the same number of wordlines in each of the Physical Sectors (PSecs).

An address decoder for calculating a physical address of a given Erase Sector (ESec) may comprise: a first pointer (ysel) specifying a given Erase Sector (ESec) within a given Erase Sector Group (ESG); a second pointer (esg) specifying a given Erase Sector Group (ESG) within a given Physical Sector (PSec); and a third pointer (psec) specifying a given Physical Sector (PSec) within the array. A pipeline unit may be provided for performing the calculations in a synchronous pipeline.

The physical address of a given memory location within a given Erase Sector (ESec) may comprise: a first pointer specifying a given wordline within the given Erase Sector (ESec); and a second pointer specifying a given page in the given Erase Sector (ESec).

An exemplary array may have 38 Erase Sector Groups (ESGs), 9 Physical Pages (slices) and 24 Physical Sectors (PSecs).

A user address may comprise a first plurality of bits specifying a given Erase Sector (ESec) and a second plurality of bits specifying an internal address with the given Erase Sector (ESec); and a physical address of a given Erase Sector (ESec) may comprises a first pointer (ysel) specifying a given Erase Sector (ESec) within a given Erase Sector Group (ESG), a second pointer (esg) specifying a given Erase Sector Group (ESG) within a given Physical Sector (PSec); and a third pointer (psec) specifying a given Physical Sector (PSec) within the array.

According to an embodiment of the disclosure, a method of addressing a non-binary array or cells of a non-binary array comprises translating the first plurality of bits into three pointers comprising: a first pointer (ysel) specifying a given Erase Sector (ESec) within a given Erase Sector Group (ESG); a second pointer (esg) specifying a given Erase Sector Group (ESG) within a given Physical Sector (PSec); and a third pointer (psec) specifying a given Physical Sector (PSec) within the array. The first, second and third pointers may be calculated using modular arithmetic.

The third pointer (psec) may be calculated based on dividing a range of Physical Sectors (PSecs) into a number of equal parts, and assigning each part a Physical Sector number (PSec#=P); and using modular subtraction to perform a number of subtractions, using the number of subtractions as the Physical Sector Number (Psec#), and using a remainder to point to the Erase Sector (ESec) within the identified Physical Sector (PSec);

The first pointer (ysel) and the second pointer (esg) may be calculated based on dividing a range of Erase Sectors (ESecs) into a number of equal parts, and assigning each part an Erase Sector Group Number (EsecG#); and using modular subtraction to perform a number of subtractions, and using the number of substations as the Erase Sector Group Number (EsecG#), and using a remainder as the value for the ysel pointer to the Physical Page (slice).

The techniques disclosed herein may be applicable to most NVM devices including, but not limited to, charge-trapping devices such as NROM (sometimes referred to as Nitride Read Only Memory), SONOS (Semiconductor Oxide Nitride Oxide Semiconductor; Silicon-Oxide-Nitride-Oxide-Silicon), SANOS (Silicon-Aluminum Oxide-Nitride-Oxide-Silicon), MANOS (Metal-Aluminum Oxide-Nitride-Oxide-Silicon), and TANOS (Tantalum-Aluminum Oxide-Nitride-Oxide-Silicon), and also to Floating Gate (FG) devices.

BRIEF DESCRIPTION OF THE DRAWING(S)

Reference will be made in detail to embodiments of the disclosure, examples of which may be illustrated in the accompanying drawing figures (FIGs). The figures are intended to be illustrative, not limiting. Although the disclosure is generally described in the context of these embodiments, it should be understood that it is not intended to limit the disclosure to these particular embodiments.

DETAILED DESCRIPTION

In the following description, various aspects of techniques for implementing and operating a Flash memory array will be described. For the purpose of explanation, specific configurations and details are set forth in order to provide a thorough understanding of the techniques. However, it will also be apparent to one skilled in the art that the techniques may be practiced without specific details being presented herein. Furthermore, well-known features may be omitted or simplified in order not to obscure the description(s) of the techniques.

Throughout the descriptions set forth in this disclosure, lowercase numbers or letters may be used, instead of subscripts. For example Vg could be written $V_g$. Generally, lowercase is preferred to maintain uniform font size.) Regarding the use of subscripts (in the drawings, as well as throughout the text of this document), sometimes a character (letter or numeral) is written as a subscript—smaller, and lower than the character (typically a letter) preceding it, such as "$V_s$" (source voltage) or "$H_2O$" (water). For consistency of font size, such acronyms may be written in regular font, without subscripting, using uppercase and lowercase—for example "VS" and "H2O". Superscripts may be designated using a carat—for example, $2^{30}$ may be written as "2^30". When powers of 10 are involved, the following notation may be used—for example, "2e13" means $2\times10^{13}$.

Acronyms or abbreviations may be pluralized by adding an "s" at the end, either with or without an apostrophe—for example "Esecs" or "Esec's", both being a plural form of the singular "Esec". Capitalization may also vary—for example, "Esec" may be written as "ESec".

Although various features of the disclosure may be described in the context of a single embodiment, the features may also be provided separately or in any suitable combination. Conversely, although the disclosure may be described herein in the context of separate embodiments for clarity, the disclosure may also be implemented in a single embodiment. Furthermore, it should be understood that the disclosure can be carried out or practiced in various ways, and that the disclosure can be implemented in embodiments other than the exemplary ones described herein below. The descriptions, examples, methods and materials presented in the in the description, as well as in the claims, should not be construed as limiting, but rather as illustrative.

According to some embodiments of the present invention, there is provided a non-volatile memory array including a plurality of Erase Sectors (Esecs) disposed according to a non-binary arrangement. The array may include a non-binary number of Esecs. The array includes a non-binary number of Physical Pages (slices). The array may include a non-binary number of Physical Sectors (PSecs). According to some embodiments, there may be a non-binary number of all of said Erase Sector Groups (ESGs), Physical Pages (slices), and Physical Sectors (PSecs).

According to further embodiments of the present invention there is provided a non-binary number of wordlines per Erase Sector Group (ESG). There may also be provided an address decoder for determining a physical address of a given Erase Sector (ESec), wherein the physical address may include a first pointer (ysel) specifying a given Erase Sector (ESec) within a given Erase Sector Group (ESG); a second pointer (esg) specifying a given Erase Sector Group (ESG) within a given Physical Sector (Psec); and a third pointer (psec) specifying a given Physical Sector (PSec) within the array. There may be provided a pipeline unit for performing the determination in a synchronous pipeline.

According to some embodiments of the present invention, a physical address of a given memory location within a given Erase Sector (ESec) may include a first pointer specifying a given wordline within the given Erase Sector (ESec); and a second pointer specifying a given page in the given Erase Sector (Esec).

According to some embodiments of the present invention, there may be provided a same number of wordlines in each of the Physical Sectors (PSecs). There may be provided 38 Erase Sector Groups (ESGs), 9 Physical Pages (slices) and 24 Physical Sectors (PSecs).

According to some embodiments of the present invention addressing cells within a non-volatile memory array including Erase Sectors disposed according to a non-binary arrangement may include translating a first set of addressing bits into a first pointer (ysel) specifying a given Erase Sector (ESec) within a given Erase Sector Group (ESG). Addressing may further include translating the first set of addressing bits into a second pointer (esg) specifying a given Erase Sector Group (ESG) within a given Physical Sector (Psec). Addressing may further include translating the first set of addressing bits into a third pointer (psec) specifying a given Physical Sector (PSec) within the array.

According to some embodiments, a combination of the first pointer (ysel) specifying the given Erase Sector (ESec) within a given Erase Sector Group (ESG), the second pointer (esg) specifying the given Erase Sector Group (ESG) within a given Physical Sector (Psec) and the third pointer (psec) specifying the given Physical Sector (PSec) within the array may define a physical address of the given Erase Sector (ESec). The first, second and third pointers may be calculated using modular arithmetic. The third pointer (psec) may be based on dividing a range of Physical Sectors (PSecs) into a number of equal parts, and assigning each part a Physical Sector number (PSec#=P).

According to some embodiments of the present invention, modular subtraction may be used to perform a number of subtractions, using the number of subtractions as the Physical Sector Number (Psec#), and using a remainder to point to the Erase Sector (ESec) within the identified Physical Sector (PSec). Calculating the first pointer (ysel) and the second pointer (esg) may be based on dividing a range of Erase Sectors (Esecs) into a number of equal parts, and assigning each part an Erase Sector Group Number (EsecG#); and using modular subtraction to perform a number of subtractions, and using the number of substations as the Erase Sector Group Number (EsecG#), and using a remainder as the value for the ysel pointer to the Physical Page (slice).

Techniques for implementing and operating a non-volatile memory (NVM) array having a non-binary number of Physical Sectors (PSecs, or PSs) and/or Erase Sectors (ESecs, or ESs) are disclosed and described. The array may also have a non-binary number of slices (physical pages) and/or erase sector groups (ESGs, or ESec Groups). A non-binary number of wordlines may be associated with each Erase Sector Group (ESG).

Flash memory is typically arranged in an array having binary dimensions, meaning that there are a binary number (such as 2, 4, 8, 16, 32 . . . ) of PSecs and ESecs, some disadvantages of which may be that:
- the die doesn't fit into all package sizes
- the die size aspect ratio is not flexible enough A non-binary concept, such as is disclosed herein, allows selecting X/Y dimensions for a die size in a more high resolution, giving more achievable X/Y combinations than current fixed binary approaches, an advantage of which is the ability to fit different package sizes.

According to an aspect of the disclosure, some technical problems which may be solved are:
1. Changing the aspect ratio of the die, in order to fit a limited package dimensions.
2. Decreasing the die size.

Another aspect of the disclosure is a method to calculate a non-binary number of physical sectors and array sectors so as to fit desired package dimensions with reduced spare array area penalty.

Another aspect of the disclosure is a method of addressing a non-binary array.

According to the disclosure, a non-binary array may include one of more of the following features:
- a non-binary number of PSecs implementation in an Array
- a non-binary number of ESecs implementation in each of the PSecs
- a non-binary number of Array WLs in implementation in each of the PSecs
- a non-binary combination of Array with binary X/Y dimensions
- a combination of binary Array dimensions and arranging them in such a way that a non-binary like Array size is achieved. For example, combining 9 (a non-binary number of) Arrays (or sub-Arrays), each having X/Y dimensions of 4/4 (binary), and arranging the 9 sub-Arrays in 3 rows and 3 columns to achieve X/Y dimensions of 12/12 (non-binary) for the overall Array.

Some advantages of the techniques disclosed herein may include:
- a tool that helps to control the aspect ratio of the Array in small resolutions, for limited packaging dimensions
- a flexible tool for defining Array Architecture
- flexible selection of Erase Sectors (Esecs) in a Physical Sector (PSec), not limited to binary numbers
- flexible selection of wordlines (WLs) in a Physical Sector (PSec), not limited to binary numbers
- saves die size area
- very small time penalty due to addresses transformation (transforming User's addresses to internal addresses for the non-binary array, discussed hereinbelow)

Figure 2:
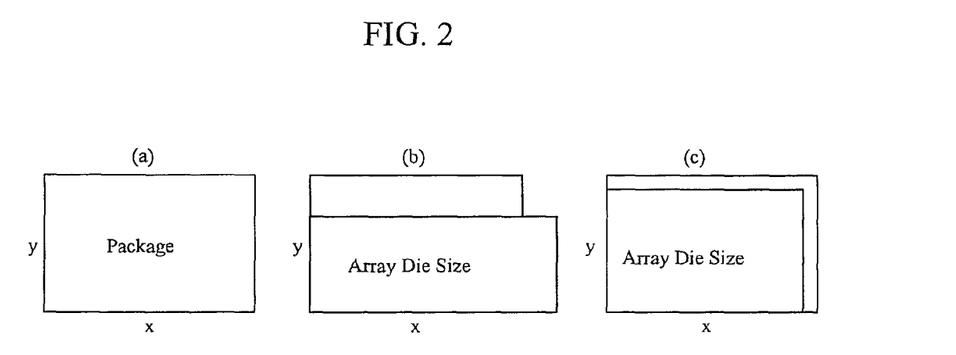
FIG. 2 is diagrams of (a) a package, (b) the package with a die of a given size, and (c) the package with another die having another size.

FIG. 2 (a, b, c) illustrates, generally, the following:
(a) a package having x/y physical dimensions
(b) a "problem", that an Array having a binary number of Physical Sectors (PSecs) and a binary number of Erase Sectors (ESecs) in a Physical Sector (Psec) may result in a chip (Array die size) with x/y dimensions that does not fit the package. (There may be a binary number of WLs in each Psec.)
(c) a "solution", that an Array having a non-binary number of PSecs and a non-binary number of ESecs in a Psec may result in a chip (Array die size) with X/Y dimensions that does fit the package, with minor Array die size penalty due to the non-binarity.

Figure 3A:
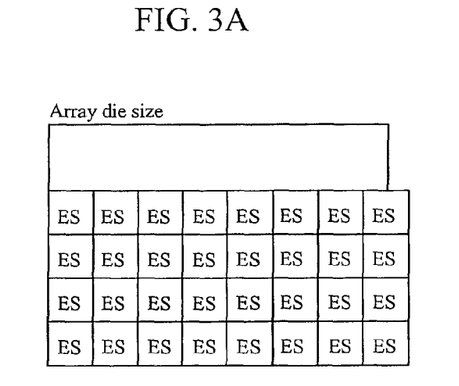
FIGS. 3A and 3B are diagrams illustrating different size memory arrays, for a given die size.
Figure 3B:
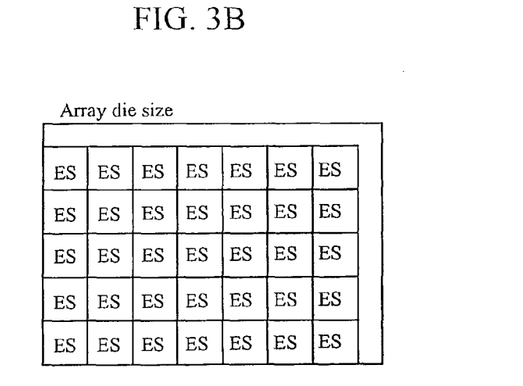

FIG. 3A illustrates a given Array die size comprising a binary array of ESecs and PSecs, and FIG. 3B illustrates the same Array die size comprising a non-binary array of ESecs and PSecs. In these figures, the abbreviation "ES" is used, rather than ESec. The ESs (ESecs) in both FIG. 3A and FIG. 3B are assumed to all be identical.

In the binary Array (FIG. 3A), there is an array of 4×8 ESecs (8 across, 4 down). Both 4 and 8 are binary numbers. The total number of ESecs is 32 (also a binary number). A PSec may be defined as a horizontal row of ESecs, and in this example there would be 4 PSecs. Notice that the array does not fit the die.

In the non-binary array (FIG. 3B), there is an array of 5×7 ESecs (7 across, 5 down). Both 5 and 7 are non-binary numbers. The total number of ESecs is 35 (also a non-binary number). A PSec may be defined as a horizontal row of ESecs, and in this example there are 5 PSecs. Notice that the array fits the die, has at least as many ESecs as the binary array of FIG. 3A, and there is only a little "wasted" die space.

These two figures (FIG. 3A and FIG. 3B) illustrate an overall, "high-level" benefit of using a non-binary array, and is seemingly straightforward to implement, from a physical point of view. However, as described below, because of the way Flash memory is addressed and accessed, it is less straightforward how to translate user binary addresses into non-binary physical (internal) addresses.

An Exemplary Non-Binary Array

FIG. 4A is a diagram of an exemplary binary array, according to the prior art. The array may have the following dimensions:
- 32 Physical Sectors (PSecs)←note that this (32) is a binary number
- 8 Physical Pages (slices)←note that this (8) is a binary number
- 32 Erase Sector Groups (ESGs) per PSec←note that this (32) is a binary number
- 32×8 Erase Sectors (ESecs) per PSec←note that this (256) is a binary number The total number of ESecs implemented in the Array is thus 32×8×32=8,192.

In the exemplary binary array of FIG. 4A, there is a binary number of all three of the logical sections (PSecs, Slices, ESecs). There may also be a binary number of wordlines, such as 32, per ESec. This is illustrative of a "binary" array, because all of the dimensions are binary numbers.

Figure 4B:
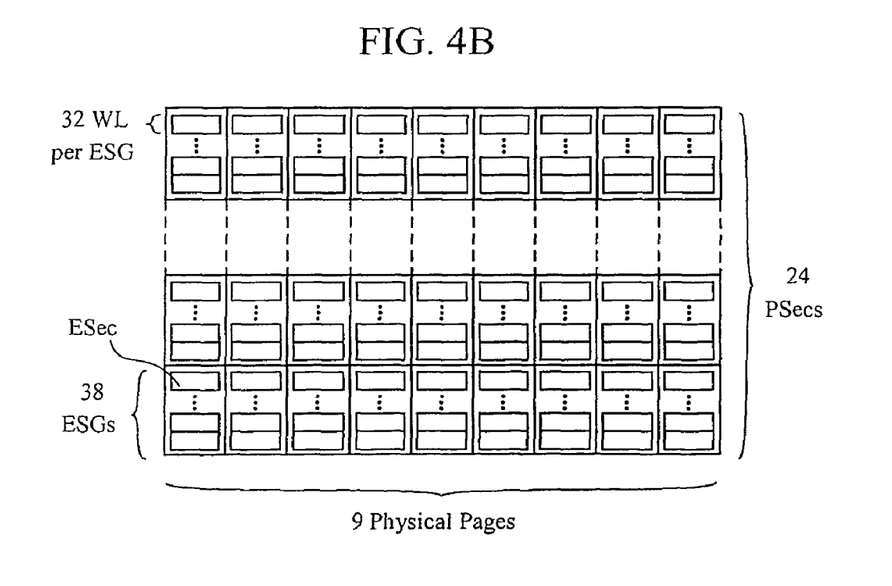
FIG. 4B is a diagram of a memory array having non-binary dimensions, according to the disclosure.

FIG. 4B is a diagram of an exemplary non-binary array, according to the disclosure. This exemplary non-binary array will be used in various examples that follow. The array may have the following non-binary dimensions:
- 24 Physical Sectors (PSecs)←note that this (24) is a non-binary number
- 9 Physical Pages (slices)←note that this (9) is a non-binary number
- 38 Erase Sector Groups (ESGs) per PSec←note that this (38) is a non-binary number
- 38×9 Erase Sectors (ESecs) per PSec←note that this (342) is a non-binary number The total number of Esec's implemented in the Array is thus 38×9×24=8,208=(8,192+16). (The number 8192 is a binary number, and the +16 is "leftover", as discussed below.)

In the exemplary non-binary array (FIG. 4B), there is a non-binary number of all three of the logical sections (PSecs, Slices, ESecs). There may also be a non-binary number of wordlines, such as 32, per ESec. For purposes of this disclosure, to be classified as a "non-binary array", there should be a non-binary number of at least one of the three logical sections (Psec's, Slices, Esec's).

In either of the binary (FIG. 4A) or non-binary (FIG. 4B) arrays, a number of wordlines (WLs) pass through each ESec, and each wordline may be divided into different sections ("pages") within a given ESec. In the non-binary array (FIG. 4B), there may be a non-binary number of wordlines (per ESec), in addition to a non-binary number of at least one of the three logical sections (PSecs, Slices, ESecs). The number of pages (sections of a wordline) within an Erase Sector (ESec) may be only a few, such as 4. As mentioned above, a "page" may be a segment of one wordline, or corresponding segments of all of the wordlines passing through an Erase Sector (Esec).

In the exemplary binary (FIG. 4A) and non-binary (FIG. 4B) arrays, there are 32 wordlines (WLs) per Erase Sector Group (ESG). An Erase Sector Group (ESG) is defined as all of the Erase Sectors (ESecs) sharing the same wordlines—for example, the topmost ESecs of all of the Physical Sectors (PSecs). A given set of wordlines passes through all of the ESecs in a given ESG and, within each ESec each of the wordlines may be divided into pages, as discussed in the previous paragraph.

In the exemplary binary array (FIG. 4A) there are 32 WLs per ESec, times 32 ESecs per PSec, times 32 PSec per slice, or 32,768 wordlines. In the exemplary non-binary array (FIG. 4B) there are 32 WLs per Esec, times 38 ESec per PSec, times 24 PSec per slice, or 29,184 wordlines, which is fewer than (approximately 90% of) the number of wordlines in the binary array (FIG. 4A). This "shortfall" is made up for (offset) by there being 9 Physical Pages (slices) in the non-binary array (FIG. 4B) rather than the 8 Physical Pages in the binary array (FIG. 4A), resulting in an increased number of bitlines (approximately 12% more) in the non-binary array than in the binary array.

Note that the non-binary array (FIG. 4B) has at least as many ESecs as the binary array (FIG. 4A). However, in either case (the binary array or the non-binary array), only 8,192 (a binary number of) ESecs can be accessed with a user address. In the case of the non-binary array, a few (16) ESecs are "left over", and may be used for testing or redundancy. (Even if these 16 ESecs were unusable, then only 16/8192=0.002 (0.2%) of the ESecs would be "wasted".

The physical layout of memory arrays has been described, and in practice, the Erase Sectors (ESecs) are physically laid out substantially much as shown in FIGS. 4A and 4B (omitting control circuitry, not shown). For the non-binary array (FIG. 4B), a challenge is how to use a binary address to access (identify, point to, use) the non-binary layout (FIG. 4B). For the user, the translation of a user address to a physical address should be "transparent" (it should happen automatically, without intervention from the user).

Addressing a Non-Binary Array

The following diagram (table) illustrates a 25-bit [24:0] user-addressing scheme, where the user can specify up to $2^{25}$ (about 33 million) distinct addresses. (For Flash memory arrays having more than that number of physical addresses, typically many more, internal addressing is handled in the chip, and is transparent to the user).

| WL# in Esec | | | | | user | Internal Page | | | | | |
|---|---|---|---|---|---|---|---|---|---|---|---|
| 11 | 10 | 9 | 8 | 7 | 6 | 5 | 4 | 3 | 2 | 1 | 0 |
| Esec | | | | | | | | | | | |
| 24 | 23 | 22 | 21 | 20 | 19 | 18 | 17 | 16 | 15 | 14 | 13 | 12 |

First, a word about the notation used herein. A series of bits, such as bit "0" to bit "5" may be designated by two numerals in brackets, separated by a colon—for example, either [5:0] or [0:5]. In the descriptions set forth herein, the convention of the higher number appearing to the left of the colon will be used. Note also, in the table above, the bits "0" to "11" (as well as the bits "12" to "24") are designated from right to left.

The lower 12 bits [11:0] of the overall 25 bits [24:0] may define an internal address inside a given erase sector (ESec). For example, The lower 6 bits [5:0] of the lower 12 bits [11:0] may be used to indicate the page (section of wordline) within the ESec to which the memory cell is "connected". Bit 6 may be a "user bit" which is selected by the user to be used for error correction code (ECC). Else, bit-6 may be used to extend the 6-bit internal page address to 7 bits. Including bit 6, this accounts for the lower 7 bits [6:0] of the lower 12 bits [11:0].

The upper 5 bits [11:7] of the lower 12 bits [11:0] may be used to indicate to which of the (for example 32) wordlines within the ESec the memory cell is connected.

The upper 13 bits [24:12] of the overall 25 bits [24:0] may be used to select the given ESec inside the chip. (Generally, the many ESecs are the same as one another throughout the chip, and this would apply to binary arrays as well as non-binary arrays.)

For a binary array, it is a simple matter to assign a few of the upper 13 bits to point to:

the Physical Page (slice) (which one of the 8, for example)
the Erase Sector Group (ESG) (which one of the 32, for example)
the Physical Sector (PSec) (which one of the 32, for example)

For purposes of this discussion, the slice, the ESG and the PSec constitute three "pointers", which point to a physical address of a given Erase Sector (ESec) in the array.

Figure 5:
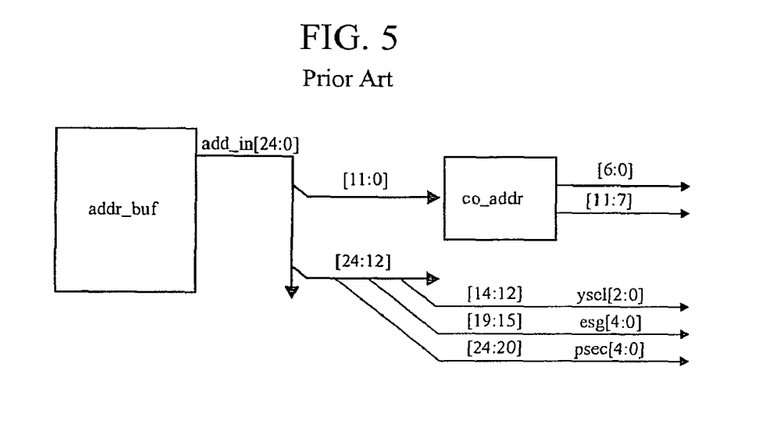
FIG. 5 is a diagram of address decoder logic for a memory array having binary dimensions, according to the prior art.

FIG. 5, for example, shows an address buffer (addr_buf) providing the 25 bit user-address [24:0] on an address bus, in the context of a binary array, such as may be used in the prior art for a binary array. It is generally a simple matter of "wiring" to translate the user's address to the physical address (3 pointers).

The first twelve bits [11:0] may be simply stripped off the address bus, and provided to an addressing block (co_addr) which specifies the page number using bits [6:0] and wordline number using bits [11:7], as described above. (This is within a given Erase Sector (ESec), the physical address of which may be specified as follows.)

The next thirteen bits [24:12] may be simply stripped off the bus, as follows:

the first three bits [14:12] may be used to specify the Physical Page (slice), otherwise referred to as "ysel", which may be three bits [2:0] for 8 Physical Pages (slices);

the next five bits [19:15] may be used to specify the Erase Sector Group (ESG, or "esg"), which may be five bits [4:0] for 32 ESGs; and the next five bits [24:20] may be used to specify the Physical Sector (PSec, or "psec"), which may be five bits [4:0] for 32 PSecs.

For a non-binary array, however, the situation is more complicated than a matter of "wiring", and the 13 bits [24:12] need to be "translated" to choose the three pointers:

the Physical Page (slice) (which one of the 9, for example)
the Erase Sector Group (ESG) (which one of the 38, for example)

the Physical Sector (PSec) (which one of the 24, for example)

For purposes of this discussion, the slice, the ESG and the PSec constitute three "pointers", which point to a physical address of a given Erase Sector (ESec) in the array.

Figure 6:
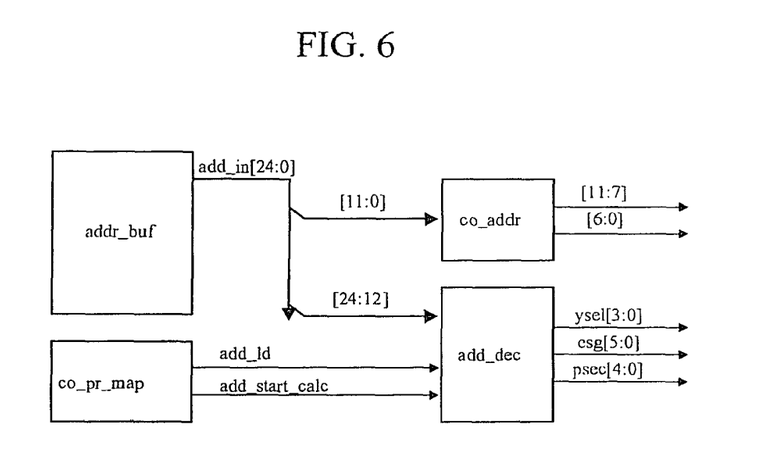
FIG. 6 is a diagram of address decoder logic for a memory array having non-binary dimensions, according to the disclosure.

Referring to FIG. 6, it can be seen that the first twelve bits [11:0] may be simply stripped off the address bus, and provided to an addressing block (co_addr) which specifies the page number using bits [6:0] and wordline number using bits [11:7], as described above. (This is within a given Erase Sector (ESec), the physical address of which may be specified as follows.) This is essentially the same for the binary array (FIG. 5) and the non-binary array (FIG. 6).

The next thirteen bits [24:12], however, are handled differently in the non-binary array (FIG. 6) than in the binary array (FIG. 5). Because the user address is binary, and the array (physical address) is non-binary, these thirteen bits [24:12] cannot simply be used "as is" to derive the three pointers (slice, ESG, PSec). Rather, these thirteen bits [24:12] may be translated by an address decoder (add_dec), to obtain (calculate) the following three pointers:

- a pointer ("ysel") to specify the Physical Page (slice), which may be four bits [3:0] for 9 Physical Pages (slices);
- a pointer ("esg") to specify the Erase Sector Group (ESG), which may be six bits [5:0] for 38 ESGs; and
- a pointer ("psec") to specify the Physical Sector (PSec), which may be five bits [4:0] for 24 PSecs.

It may be noted that the three pointers of the non-binary array require 15 (4+6+5) bits, in contrast with the three pointers for the (comparable size) binary array which required 13 (3+5+5) bits. This is because, for example, for the binary array the "ysel" is 3 bits and all 3 bits are used up for selecting the 8 Physical Pages (slices), and in the non-binary array 4 bits are needed to select among 9 Physical Pages (slices). The 4 bits for the "ysel" pointer in the non-binary array could select up to 16 Physical pages (all of the possibilities are not exploited). Overall, 2 more bits (15 rather than 13) are used for addressing the non-binary array in this example. Thus, the non-binary addressing scheme (bits required for the pointers) is inherently less efficient from the point of view of address range. The calculation of the pointers for the non-binary array is discussed in greater detail hereinbelow.

FIG. 6, for example, shows an address buffer (addr_buf) providing the 25 bit user-address [24:0] on an address bus, in the context of a non-binary array.

As with the example for a binary array, the first twelve bits [11:0] may simply be stripped off the bus, and provided to an addressing block (co_addr) which specifies the page number using bits [6:0] and the wordline number using bits [11:7], as described above.

For converting the upper thirteen user address bits [24:12], a port map (co_pr_map) is located inside the chip. (This is conventional, although not shown in FIG. 5.) The port map provides two signals (add_ld and add_start-calc) to an address decoder (add_dec). These two signals are needed in order to calculate the physical address from the logical (user) address, to do the conversion. The port map controls the flow of the calculation of the three pointers. The start signal (add_start_calc) is used to start the calculation of the three pointers. The load signal (add_ld) loads the 15 bits of the decoded non-binary 3 pointers to internal register (add_dec).

Figure 7:
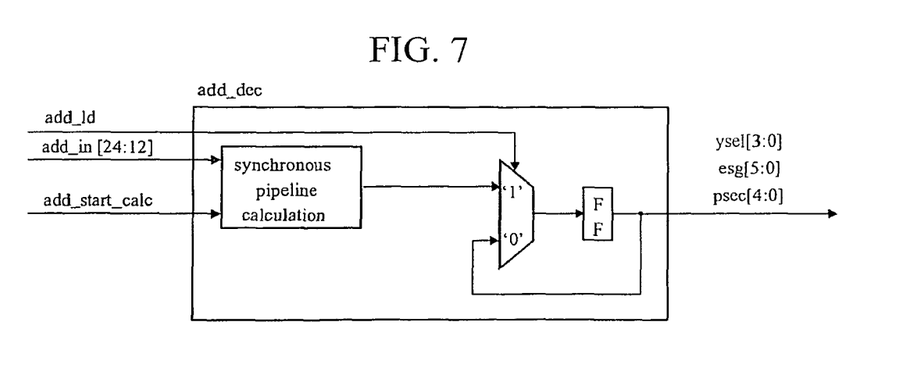
FIG. 7 is a diagram of address decoder logic for a memory array having non-binary dimensions, according to the disclosure.

FIG. 7 shows the internal structure of the address decoder (add_dec) of FIG. 6, which generally comprises the following:

- an optional pipeline unit for performing synchronous pipeline calculations. The thirteen bits [24:12] of user-address are provided as an input, along with the add_start_calc signal. The calculation of the three pointers is somewhat complicated, and is discussed in greater detail hereinbelow. A pipeline may be used to save logic. Otherwise, the calculations could be done in parallel.
- a multiplexer (mux; '1', '0'), which selects when to load the calculated result into the register (FF, flip flop), in response to the add_ld signal. The mux samples the output of the calculation.
- a flip-flop (FF), outputting the three internal address signals (pointers ysel, esg, psec).

Address Decoder—Intuitive Bits

| WL# in Esec | | | | user | | | Internal Page | | | | |
|---|---|---|---|---|---|---|---|---|---|---|---|
| 11 | 10 | 9 | 8 | 7 | 6 | 5 | 4 | 3 | 2 | 1 | 0 |
| | | | | Esec | | | | | | | |
| 24 | 23 | 22 | 21 | 20 | 19 | 18 | 17 | 16 | 15 | 14 | 13 | 12 |

The user may insert, for example, 30+1=31 address bits for a byte resolution. Each of the 31 points to a different byte in the chip. A byte is normally (conventionally) 8 bits. But internally, the resolution is generally 512 bits rather than 8 bits. Therefore, the lowest 6 bits in the address may be dropped, and 31 bits becomes 25 bits. The "+1" is bit 6, or A[6], and is not used in the calculation, and may be a redundancy bit.

Therefore, $2^{30} \times 8 = 2^{33} = 8$ Gbits (without user address bit).

The Array logic address is 24+1=25 address bits for 512 bits resolution.

Therefore, $2^{24} \times 512 = 2 \times 8$ Gbits (without user address bit)

A[5:0]=internal page address=$2^6 * 512$=4 KB

A[6]=user address bit

A[11:7]=WL# in e-sector=$2^5$=32 WLs=32×4 KB=128 KB

Address Decoder—Array Sizes

Array sizes:

9 Esec in Esec group (because there are 9 slices, or physical pages)

38 Esec groups in each Psec

24 Psec in the Array

Total number of Esec in chip is: 9×38×24=8,208=8,192+16

Address Decoder—Decoding Pointers

Total number of Esec in user address space is $2^{13}$=8,192 (The remaining 16 bits are not accessed by the user. They can be used for Testing/Redundancy or not to be used at all.)

Three (3) pointers may be extracted from these 13 bits [24:12]:

| | |
|---|---|
| Ysel [3:0] = 0 . . . 8 | 4 bits |
| ESG# [5:0] = 0 . . . 37 | 6 bits |
| PSec# [4:0] = 0 . . . 23 | 5 bits |
| | 15 bits |

Non-Binary Flash Array Architecture—Example
Refer to FIG. 4B.

The total number of Erase Sectors (ESecs) implemented is 24×38×9=8,208=8,192+16
- 38 Esec
- 9 physical pages (or "slices")
- 24 Psec Only 8,192 Erase Sectors (ESecs) can be accessed by user address An Erase Sector Group (EG) is as wide as the Physical Sector (PSec). An Erase Sector (ESec) has same height as Esec Group, but only ⅑ of the width.

"Page": not shown: each Erase Sector Group (ESG) contains 32 WL. Each Erase Sector (ESec) may contain a widthwise segment of all 32 WL. A page is ⅑ of one WL. In one Erase Sector (ESec), there may be 32 pages.

Three pointers are used to select one Erase Sector (ESec), as described above, which are: Physical Page (slice), Erase Sector Group (ESG), and Physical Sector (PSec).

Address Decoder—PSec

Refer to FIGS. 6 and 7 showing the address decoder (add_dec). Following the example, there are 8,208 Erase Sectors (ESecs). The upper thirteen bits [24:12] indicate the Erase Sector (ESec) in the array, as described above.

The Physical Sector pointer (psec) divides this range to 24 equal parts, or Physical Sector Numbers (Psec#), each having 342 Erase Sectors (Esecs):

0→341→Psec#[4:0]="00000"
342→683→Psec#[4:0]="00001"
. . .
7866→8207→Psec#[4:0]="10111"

After deciding on (assigning) the Physical Sector number (PSec#=P), decrement the address number by P×342 in order to get a number between 0 to 341. In other words, using modular arithmetic, subtracting 342, over and over, and the number of subtractions is the Physical Sector Number (Psec#) 0 to 23 (24 PSecs). The remainder (after the modular subtraction), 0 to 341 is used to point to (as the value for) the Erase Sector (ESec) within the identified Physical Sector (PSec).

Address Decoder—esg and ysel

There are 342 Erase Sectors (ESecs) per Physical Sector (PSec).

Esec# divides this range to 38 equal parts and assigning each part an Erase Sector Group Number (EsecG#):

0→8→EsecG#[5:0]="000000"
9→17→EsecG#[5:0]="000001"
. . .
333→341→EsecG#[5:0]="100101"

After deciding on Erase Sector Group number (ESG#=E), decrement the address number by E×9 in order to get a number between 0 to 8. In other words, modular arithmetic is used, subtracting 9 each time. The number of subtractions is the Erase Sector Group Number (EsecG#). And, the remainder (0 to 8) is the value for the ysel pointer to the Physical Page (slice).

Address Decoder Conversion, an Example

Given PSec # (P), ESG # (G) within the PSec and ESec # (S) within the ESG, the address (U) should be:

$$U=P*342+G*9+S$$

For example, if user wants to access PSec #1, ESG #37 and ESec #6 within the ESG group, the user address that should be inserted is:

$$U=1*342+37*9+6=681$$

Physical Address Given a User Address:

Given user address (U) the physical address parameters are:

$$S=(U \bmod 342) \bmod 9;$$

$$G=(U \bmod 342) \text{div } 9; P=U \text{ div } 342$$

where:
"mod" is the remainder of division.
"div" is the integer result of division rounded down.

For example, if the user wants to access ESec #681, the physical address parameters are:

$$P=681 \text{ div } 342=1; G=(681 \bmod 342)\text{div } 9=37;$$
$$S=(681 \bmod 342)\bmod 9=6$$

Address Decoder—Unused Erase Sectors (Esecs)

There are 8,208−8,192=16 unmapped Erase Sectors (ESecs) for user. These are the last 16 E-sectors in the chip.

Assume that the user can enter A[24:12]=8,193 (overflow).
So last PSec is selected: 8,192−23×342=326
And one before last ESec is selected: 326−36×9=2
And the 2nd ysel is selected Thus, all of the 16 unused Erase Sectors (ESecs) may be the last 16 Erase Sectors (ESecs) in the last Physical Sector (PSec).

These E-sectors can be accessed by:
Microcontroller, or other controller, can overwrite the pointers (ysel, esg, psec)
Port-Map sets a tst_ext_esec_acc flag.

Flash Array Architecture, an Example

The table below shows an example of Flash array architecture.

The 24 Physical Sectors (PSecs, or PSs) are designated in the left-hand column, from PS#0 (which has an address of "00000") through PS#23 (which has an address of "10111").

The 9 Physical Pages (slices) are designate across the top row, from "0000" through "1000".

For each of the twenty-four Psec's (PS#0 through PS#23), there are 38 Erase Sector Groups (ESGs, or EGs), numbered consecutively, as EG#0 through EG#37. These are designated in the right-hand column.

A first row shows 9 Erase Sectors (ESecs), numbered "0" through "8", for EG#0 in PS#0.
A next (second) row shows the 9 ESecs for EG#1 in PS#0.
A next (third) row shows the 9 ESecs for EG#2 in PS#0.
A next (fourth) row shows the 9 ESecs for EG#3 in PS#0.
. . . and so forth . . .
A final (thirty-eighth) row shows the 9 Esecs for EG#37 in PS#0.

Note that in PS#23, the last two rows, which would be EG#36 and EG#37 in PS#23, the last 16 ESecs (8192-8207) cannot be accessed by the user. These ESecs are shown in italics.

|      | "0000" | "0001" | "0010" | "0011" | "0100" | "0101" | "0110" | "0111" | "1000" |      |
|------|--------|--------|--------|--------|--------|--------|--------|--------|--------|------|
| PS#0 | 0      | 1      | 2      | 3      | 4      | 5      | 6      | 7      | 8      | EG#0 |
| PS#0 | 9      | 10     | . . .  | . . .  | . . .  | . . .  | . . .  | . . .  | . . .  | EG#1 |
| PS#0 | 18     | . . .  | . . .  | . . .  | . . .  | . . .  | . . .  | . . .  | . . .  | EG#2 |

-continued

|  | "0000" | "0001" | "0010" | "0011" | "0100" | "0101" | "0110" | "0111" | "1000" |  |
|---|---|---|---|---|---|---|---|---|---|---|
| PS#0 | 27 | ... | ... | ... | ... | ... | ... | ... | ... | EG#3 |
| PS#0 | ... | ... | ... | ... | ... | ... | ... | ... | ... | ... |
| PS#0 | 333 | 334 | 335 | 336 | 337 | 338 | 339 | 340 | 341 | EG#37 |
| PS#1 | 342 | 343 | 344 | ... | ... | ... | ... | 349 | 350 |  |
| PS#1 | 351 | 352 | ... | ... | ... | ... | ... | ... | ... |  |
| PS#1 | 360 | ... | ... | ... | ... | ... | ... | ... | ... |  |
| PS#1 | 369 | ... | ... | ... | ... | ... | ... | ... | ... |  |
| PS#1 | ... | ... | ... | ... | ... | ... | ... | ... | ... |  |
| PS#1 | 675 | ... | ... | ... | ... | ... | 681 | 682 | 683 |  |
|  | ... |  |  |  |  |  |  |  |  |  |
| PS#23 | 7866 | 7867 | 7868 | ... | ... | ... | ... | ... | 7874 |  |
| PS#23 | 7875 | 7876 | ... | ... | ... | ... | ... | ... | ... |  |
| PS#23 | 7884 | ... | ... | ... | ... | ... | ... | ... | ... |  |
| PS#23 | ... | ... | ... | ... | ... | ... | ... | ... | ... |  |
| PS#23 | 8190 | 8191 | 8192 | 8193 | 8194 | 8195 | 8196 | 8197 | 8198 |  |
| PS#23 | 8199 | 8200 | 8201 | 8202 | 8203 | 8204 | 8205 | 8206 | 8207 |  |

Some Distinguishing Characteristics of the Disclosure

U.S. Pat. Nos. 5,315,558 and 5,854,763 are discussed hereinabove. Some similarities between the techniques disclosed herein and those patents may be:

1. A problem being addressed is that a package having X/Y dimensions tends to limit the memory size that can be used when dealing only with binary memory dimensions.
2. In general, a non-binary memory array may better fit the package.

There are, however, several differences between the techniques disclosed herein and those of the aforementioned patents, including, for example:

1. The present disclosure provides a solution for the Flash array industry, whereas the aforementioned patents are directed to the SRAM/DRAM industry.
2. The aforementioned patents rely on using "pre-defined memories from the shelf" with binary sizes as a building stone to create a non-binary flash Array. This is generally not feasible in Flash memory.
   i. For Flash memory, there may be a layout limitation that all physical sectors be of the same size (whether binary or non-binary).
   ii. For Flash memory, there may be a layout limitation that all erase sectors be of the same size (whether binary or non-binary).
   iii. This means, for example, that a combination of pre-defined physical sector blocks of different sizes cannot be used in order to get a non-binary number, as is the case with the aforementioned patents. This means, for example, that a physical sector of binary size "4" cannot be combined with a physical sector of binary size "2" to obtain a physical sector of non-binary size "6". (All PS in Array must be of the same size, otherwise the layout design of the Array will be difficult, and also there will be a reliability issue due to Array non-uniformity. A similar "rule" applies to erase sector size.)
   iv. Because binary models cannot be used as a building block for a non-binary Array, it means that the address decoding for the non-binary arrays disclosed herein are much more complex. For example, it is not possible to assign a few bits from the address bus to access few of the internal models which has a binary size (since no internal model can be of binary size). Instead, all of the address bus bits are used to define which erase sector in which physical sector is accessed.
   v. There may be a design limitation of how many wordlines can be in an erase sector, and also totally in a physical sector (due to physical phenomena). This limitations must be considered when coming to find a non-binary memory flash Array structure.
   vi. Despite these physical limitations, the present disclosure has some more degree of freedom then what is described in aforementioned patents. Since "pre-defined memories from the shelf" which are of a binary size are not being used, any non-binary dimensions can be chosen—for example, dimensions of x/y=9/24 or x/y=10/23, and so on . . . .
   vii. In the aforementioned patents "pre-defined memories from the shelf" are used, which means that each one of them is stand-alone. In the flash design disclosed herein, each erase sector or physical sector cannot be operated as a stand-alone unit, since they all have a common column select and a common row decoder (which is translated from the address to select a memory cell).

While a number of exemplary aspects and embodiments have been discussed above, those of skill in the art will recognize certain modifications, permutations, additions and sub-combinations thereof. It is therefore intended that the following appended claims and claims hereafter introduced be interpreted to include all such modifications, permutations, additions and sub-combinations.

What is claimed is:

1. A non-volatile memory array comprising:
   a plurality of Erase Sectors (Esecs) disposed according to a non-binary arrangement; and
   an address decoder for determining a physical address of a given Erase Sector (ESec) using modular arithmetic, wherein the physical address includes:
      a first pointer (ysel) specifying a given Erase Sector (ESec) within a given Erase Sector Group (ESG);
      a second pointer (esg) specifying a given Erase Sector Group (ESG) within a given Physical Sector (Psec); and
      a third pointer (psec) specifying a given Physical Sector (PSec) within the array.

2. The array according to claim 1, wherein the array includes a non-binary number of Esecs.

3. The array according to claim 1, wherein the array includes a non-binary number of Physical Pages (slices).

4. The array according to claim 1, wherein the array includes a non-binary number of Physical Sectors (PSecs).

5. The array of claim 1, wherein the array includes a non-binary number of Erase Sector Groups (ESGs), Physical Pages (slices), and Physical Sectors (PSecs).

6. The array of claim 1, wherein there is a non-binary number of wordlines per Erase Sector Group (ESG).

7. The array of claims 1, further comprising a pipeline unit for performing the determination in a synchronous pipeline.

8. The array of claim 1, wherein a physical address of a given memory location within a given Erase Sector (ESec) comprises:
    a first pointer specifying a given wordline within the given Erase Sector (ESec); and
    a second pointer specifying a given page in the given Erase Sector (Esec).

9. The array of claim 1, wherein there are a same number of wordlines in each of the Physical Sectors (PSecs).

10. The array of claim 1, wherein there are 38 Erase Sector Groups (ESGs), 9 Physical Pages (slices) and 24 Physical Sectors (PSecs).

11. A method of addressing cells within a non-volatile memory array including Erase Sectors disposed according to a non-binary arrangement, said method comprising:
    using modular arithmetic, translating a first set of addressing bits into a first pointer (ysel) specifying a given Erase Sector (ESec) within a given Erase Sector Group (ESG); and
    using modular arithmetic, translating the first set of addressing bits into a second pointer (esg) specifying a given Erase Sector Group (ESG) within a given Physical Sector (Psec).

12. The method according to claim 11, further comprising translating the first set of addressing bits into a third pointer (psec) specifying a given Physical Sector (PSec) within the array.

13. The method according to claim 12, wherein for a given ESec a combination of the first pointer (ysel) specifying the given Erase Sector (ESec) within a given Erase Sector Group (ESG), the second pointer (esg) specifying the given Erase Sector Group (ESG) within a given Physical Sector (Psec) and the third pointer (psec) specifying the given Physical Sector (PSec) within the array define a physical address of the given Erase Sector (ESec).

14. The method of claim 12, further comprising calculating the third pointer (psec) based on dividing a range of Physical Sectors (PSecs) into a number of equal parts, and assigning each part a Physical Sector number (PSec#=P).

15. The method of claim 14, further comprising using modular subtraction to perform a number of subtractions, using the number of subtractions as the Physical Sector Number (Psec#), and using a remainder to point to the Erase Sector (ESec) within the identified Physical Sector (PSec).

16. The method of claim 15, further comprising calculating the first pointer (ysel) and the second pointer (esg) based on dividing a range of Erase Sectors (Esecs) into a number of equal parts, and assigning each part an Erase Sector Group Number (EsecG#); and using modular subtraction to perform a number of subtractions, and using the number of substations as the Erase Sector Group Number (EsecG#), and using a remainder as the value for the ysel pointer to the Physical Page (slice).

17. A non-volatile memory device comprising:
    a controller;
    a plurality of Erase Sectors (Esecs) disposed according to a non-binary arrangement; and
    an address decoder for determining a physical address of a given Erase Sector (ESec), wherein the physical address includes:
        a first pointer (ysel) specifying a given Erase Sector (ESec) within a given Erase Sector Group (ESG);
        a second pointer (esg) specifying a given Erase Sector Group (ESG) within a given Physical Sector (Psec); and
        a third pointer (psec) specifying a given Physical Sector (PSec) within the array.

18. A non-volatile memory array comprising:
    a plurality of Erase Sectors (Esecs) disposed according to a non-binary arrangement, wherein a physical address of a given memory location within a given Erase Sector (ESec) is determined using modular arithmetic and comprises:
    a first pointer specifying a given wordline within the given Erase Sector (ESec); and
    a second pointer specifying a given page in the given Erase Sector (Esec).

19. A non-volatile memory device comprising:
    a controller; and
    a plurality of Erase Sectors (Esecs) disposed according to a non-binary arrangement;
    wherein a physical address of a given memory location within a given Erase Sector (ESec) is determined using modular arithmetic and comprises:
        a first pointer specifying a given wordline within the given Erase Sector (ESec); and
        a second pointer specifying a given page in the given Erase Sector (Esec).

\* \* \* \* \*